(12) United States Patent
Nakajima (10) Patent No.: US 8,183,645 B2
(45) Date of Patent: May 22, 2012

(54) POWER SEMICONDUCTOR DEVICE INCLUDING GATE LEAD-OUT ELECTRODE

(75) Inventor: Kouji Nakajima, Shiga (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 402 days.

(21) Appl. No.: 12/588,392

(22) Filed: Oct. 14, 2009

(65) Prior Publication Data
US 2010/0096703 A1    Apr. 22, 2010

(30) Foreign Application Priority Data

Oct. 16, 2008 (JP) ................... 2008/267840
Jun. 9, 2009 (JP) ................... 2009/138631

(51) Int. Cl.
*H01L 21/70* (2006.01)
(52) U.S. Cl. ............... 257/390; 257/E23.153; 438/157
(58) Field of Classification Search ............... 257/390, 257/E23.153; 438/157
See application file for complete search history.

(56) References Cited

FOREIGN PATENT DOCUMENTS

| JP | 9-139496 | 5/1997 |
|----|----------|--------|
| JP | 2001-36081 | 2/2001 |

*Primary Examiner* — Thao Le
*Assistant Examiner* — Matthew Gordon
(74) *Attorney, Agent, or Firm* — McGinn IP Law Group, PLLC (57) ABSTRACT

Flexibility for the design of the pattern layout of the gate lead-out electrode and the source electrode is enhanced without increasing the chip thickness of the semiconductor device. A semiconductor device includes a cell region where plural transistor cells are arranged and a gate finger region different from a region where the cell region is formed. In the cell region, a gate electrode formed of a polysilicon (first conductive material) is formed. A polysilicon layer formed indivisibly with the gate electrode is formed in the gate finger region. An adhesion metal layer and a wiring metal layer are formed above the polysilicon layer by a lift-off method. The gate lead-out electrode is formed of a laminate structure including the polysilicon layer, the adhesion metal layer, and the wiring metal layer. A single layer of interlayer insulation film covering them is formed, on which a source electrode is formed.

12 Claims, 9 Drawing Sheets

POWER SEMICONDUCTOR DEVICE INCLUDING GATE LEAD-OUT ELECTRODE

BACKGROUND

1. Field of the Invention

The present invention relates to a semiconductor device and a manufacturing method thereof.

2. Description of Related Art

In semiconductor devices such as a power MOSFET (Metal-Oxide Semiconductor Field-Effect Transistor), a gate lead-out electrode for leading out a gate electrode of a MOSFET cell, so-called a gate finger is disposed to the outer periphery of a cell region where a number of MOSFET cells are arranged.

Figure 6A:
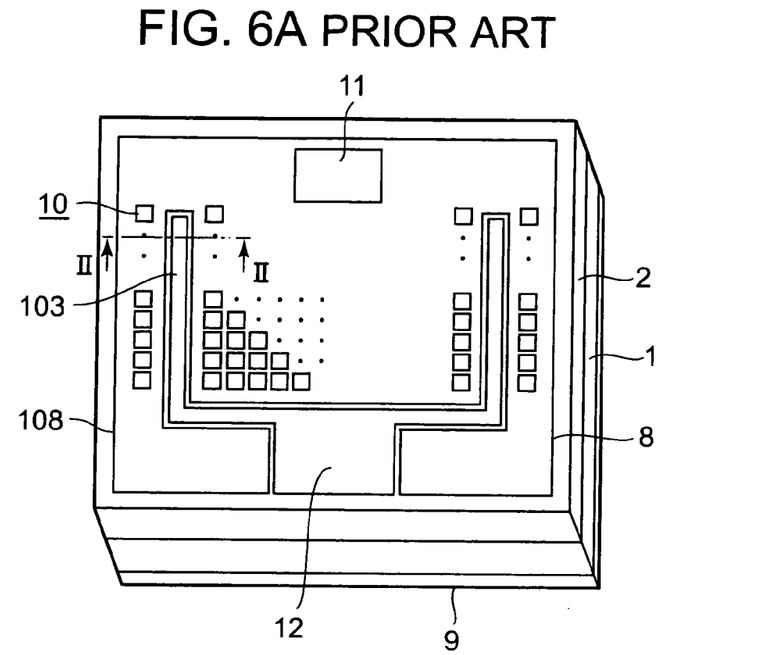
FIG. 6A is a perspective view showing a semiconductor device of the prior art disclosed in Reference 1.
Figure 6B:
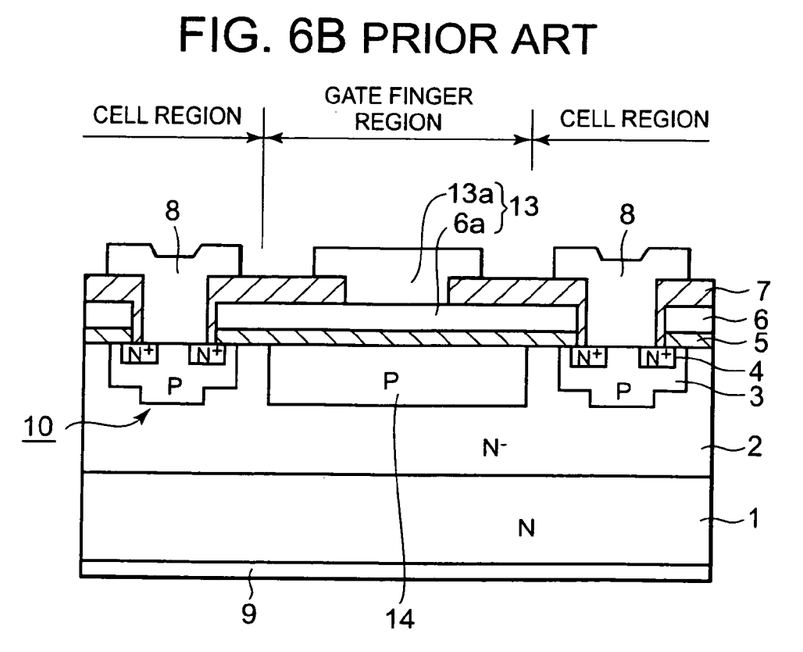
FIG. 6B is a cross sectional view along line II-II in FIG. 6A.

Japanese Unexamined Patent Application Publication (JP-A) No. 9-139496 (Reference 1) describes a cell region in which plural MOSFET cells 10 each having an N⁻type epitaxial layer 2 that functions as a drain formed on an N-semiconductor substrate 1, a P-type well 3 and a ring-like rectangular N⁺ type source region 4 formed in the surface layer portion thereof and a gate electrode 6 formed via a gate oxide film 5 above the substrate so as to ride over an MOSFET cell 10 arranged in a matrix as a vertical MOSFET (refer to FIG. 6A and FIG. 6B).

As shown in FIG. 6B, a source electrode 8 made of aluminum for connecting the source regions 4 of each of the MOSFET cells 10 is formed on the surface of the chip, and the source electrode 8 is connected with a source pad 11.

Further, as shown in FIG. 6A, a gate finger 13 is disposed about at the outer periphery of the cell region.

Further, the gate finger 13 is disposed on the gate oxide film 5 formed above the surface of the semiconductor substrate 1, composed of a polysilicon layer 6a for leading out a gate formed indivisibly with the gate electrode 6 made of polysilicon and an aluminum layer 13a disposed thereon, and is connected to a gate pad 12.

Further, the gate electrode 6 and the polysilicon layer 6a are covered with an interlayer insulation film 7 so as not to short circuit with the source electrode 8. Further, a drain electrode 9 made of aluminum is formed on the rear face of the semiconductor substrate 1.

Figure 8A:
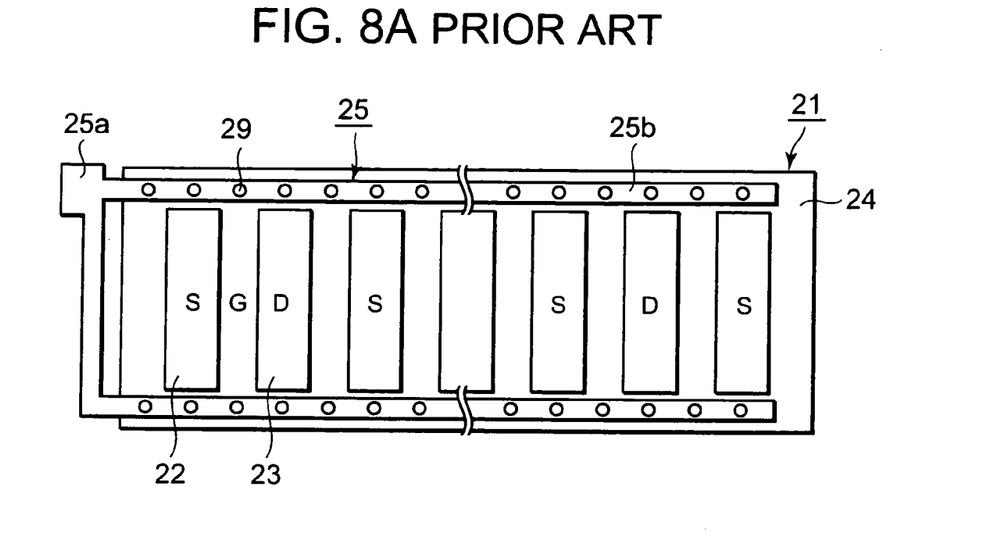
FIGS. 8A and 8B are plan views showing the semiconductor device of the prior art disclosed in Reference 2.
Figure 8B:
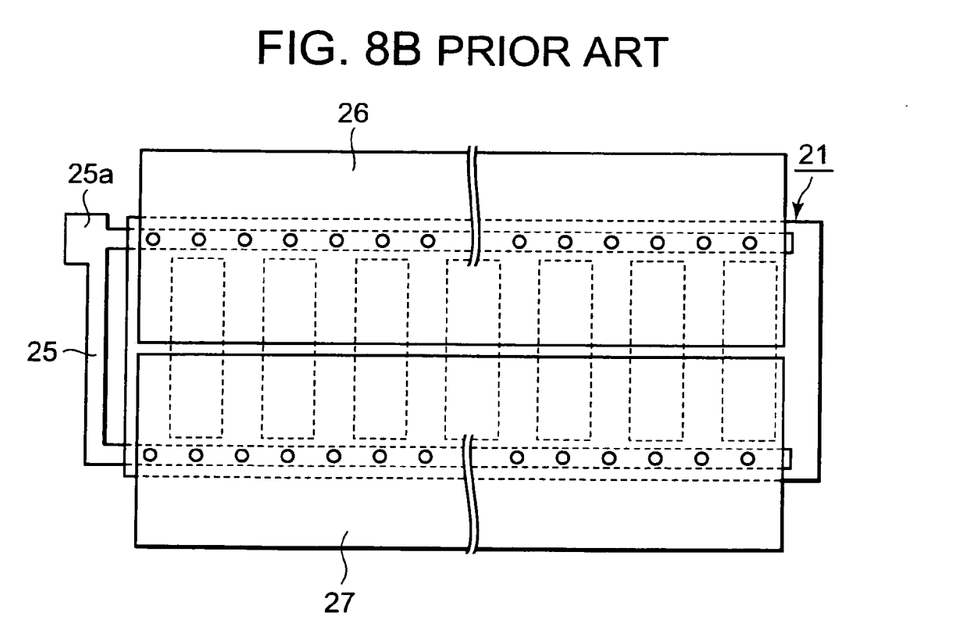

On the other hand, Japanese Unexamined Patent Application Publication (JP-A) No. 2001-36081 (Reference 2) describes a constitution in which gate signal wirings made of aluminum extending in the direction where plural gate electrode portions are arranged by way of an interlayer insulation film above a polysilicon wirings of a DMOSFET formed in a ladder-shape, and the gate signal wirings thereof are electrically connected with the polysilicon wirings through plural contact vias (refer to FIG. 8A and FIG. 8B).

As shown in FIG. 8A, a wiring pattern portion 21 is connected to the gate signal wirings 25 of the upper layer made of aluminum through plural contact vias 29 formed in a first interlayer insulation film (not illustrated). Further, the gate signal wiring 25 has a pad portion 25a and an extension portion 25b extending from the pad portion 25a along a gate connection wiring portion 24. As shown in FIG. 8B, the gate signal wiring 25 is covered with a second interlayer insulation film (not illustrated). A source lead-out wiring 26 and a drain lead-out wiring 27 of the upper layer made of aluminum are formed over the second interlayer insulation film.

Further, reference 2 describes that an interlayer connection pad (not illustrated) is formed in the same layer with a gate signal wiring 25 for electrically connecting a source lead-out wiring 26 and a drain lead-out wiring 27 with a source region 22 and a drain region 23, respectively.

Figure 7:
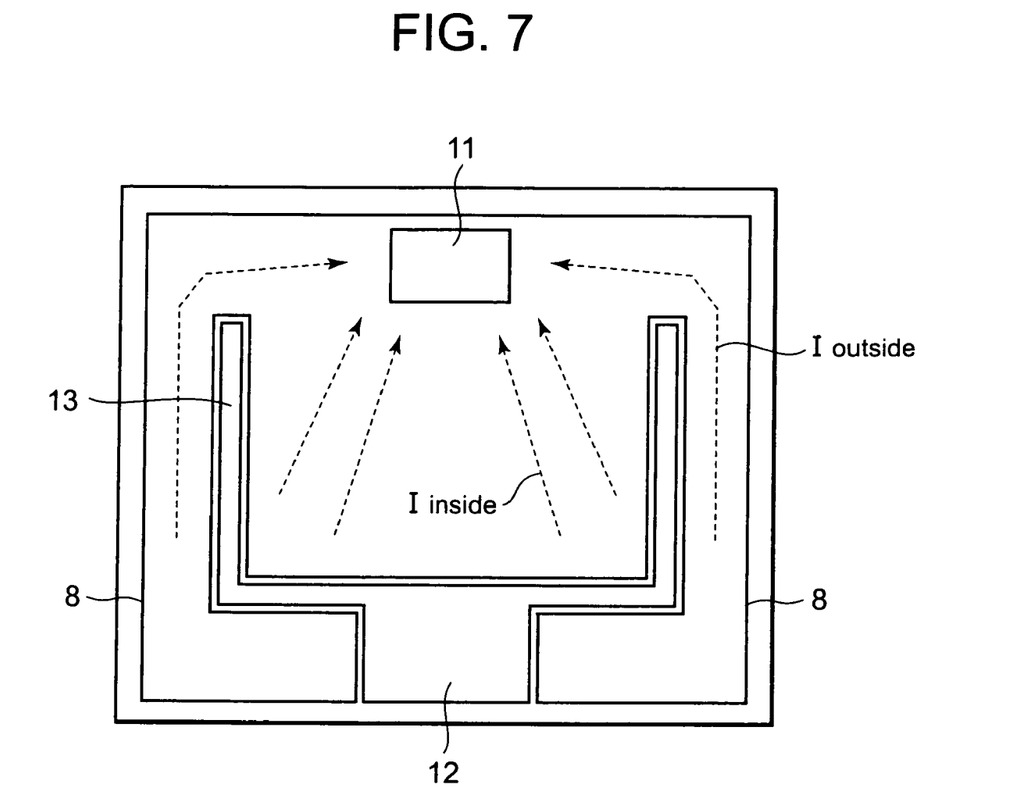
FIG. 7 is a plan view schematically showing a problem in the semiconductor device of the prior art disclosed in Reference 1.

However, the present inventor considers that the prior art described above involves the following problems and a further improvement is necessary therefor. The problems in the technique described for FIG. 6A and FIG. 6B to be described with reference to FIG. 7. FIG. 7 is a plan view schematically showing a flow of an electric current of the semiconductor device shown in FIG. 6A and FIG. 6B.

In the vertical power MOSFET described above, current flows to a source electrode 8 as shown in FIG. 7. In this case, since the source electrode 8 and a gate finger 13 are formed in a common layer, it is necessary that the source electrode 8 is arranged so as not to overlap the gate finger 13. Since the gate finger 13 is arranged in a state of intruding into the cell region so as to traverse the cell region, the current branches into a current $I_{inside}$ flowing in the source electrode 8 inside of the gate finger 13 and a current $I_{outside}$ flowing in the outside source electrode 8 of the gate finger 13. As shown in FIG. 7, since the current $I_{outside}$ has to flow through a path round about the gate finger 13 and the current path is made longer by so much when compared with the current $I_{inside}$. As a result, this increases the entire on-resistance of the vertical power MOSFET.

On the other hand, in the technique described for FIG. 8A and FIG. 8B, since the source lead-out wiring 26 (source electrode) and the gate signal wiring (gate finger) 25 are formed in different layers, pattern layout for each of them can be designed flexibly. However, this involves a problem that the number of steps of forming the interlayer insulation film increases more compared with the semiconductor device shown in FIG. 6A and FIG. 6B. That is, when the gate signal wiring 25 made of aluminum is patterned, it is necessary to form an interlayer insulation film for protecting the polysilicon wiring in the lower layer and an interlayer insulation film for insulating the gate signal wiring 25 and the source lead-out wiring 26. Further, increase in the number of the layers for the interlayer insulation film is not preferred since this increases the chip thickness and may possibly increase the frequency for the occurrence of cracking or peeling in the interlayer insulation film.

SUMMARY

In one aspect of the present invention, a semiconductor device comprises a substrate containing a cell region in which a plurality of transistor cells are arranged; a gate electrode formed in the cell region above the substrate and made of a first conductive material; a gate lead-out electrode formed in a gate finger region different from the cell region and composed of a laminate structure including a first layer made of the first conductive material and a wiring metal layer formed on the first layer; an interlayer insulation film composed of a single layer and covering the gate electrode and the gate lead-out electrode; and a source electrode formed above the interlayer insulation film, in which an entire area of the wiring metal layer is bonded to the first layer without intervening an interlayer insulation film.

In another aspect of the present invention, a method of manufacturing a semiconductor includes a cell region in which plural transistor cells are arranged, a gate electrode, and a gate lead-out electrode formed in a gate finger region different from the region where the cell region is formed. The method comprises (a) forming a gate electrode and a first layer of a gate lead-out electrode with a first conductive material above a semiconductor layer; (b) forming a photoresist layer over the entire surface above the gate electrode and the first layer; (c) forming an opening in the photoresist layer so that a portion of the first layer of the gate lead-out electrode is exposed; (d) depositing a wiring metal layer on the photoresist layer and the portion of the first layer of the gate lead-out electrode which is exposed via the opening; (e) lifting-off the wiring metal layer formed on the photoresist layer with the photoresist layer; (f) forming an interlayer insulation film over the entire surface including the first layer and the wiring metal layer; (g) selectively removing the interlayer insulation film thereby forming a contact via reaching the source region formed in the cell region; and (h) forming a source electrode on the interlayer insulation film and electrically connecting the source electrode with the source region.

According to the present invention, since the metal wiring layer of the gate lead-out electrode pattern is formed by a lift-off method using the photoresist layer as a mask, it is not necessary to form the interlayer insulation film for protecting the gate electrode upon patterning the metal wiring layer. Accordingly, the gate electrode and the gate lead-out electrode can be covered by the formation of a single interlayer insulation film. This can dispose the gate lead-out electrode and the source electrode indifferent layers without increasing the number of interlayer insulation films.

Since the number of layers for the interlayer insulation films is not increased by the constitution of covering the gate electrode and the gate lead-out electrode by the single interlayer insulation film, the gate lead-out electrode and the source electrode can be formed in different layers without increasing the chip thickness and the pattern lay out for each of them can be designed flexibly. Accordingly, increase of the on-resistance of the semiconductor device can also be prevented. Further, potential for increasing the cracking or peeling of the interlayer insulation film can also be prevented.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Preferred embodiments of a semiconductor device and a manufacturing method thereof according to the present invention are to be described specifically with reference to the drawings. In the description for the drawings, identical elements carry identical reference numerals for which duplicate descriptions are to be omitted.

Figure 1A:
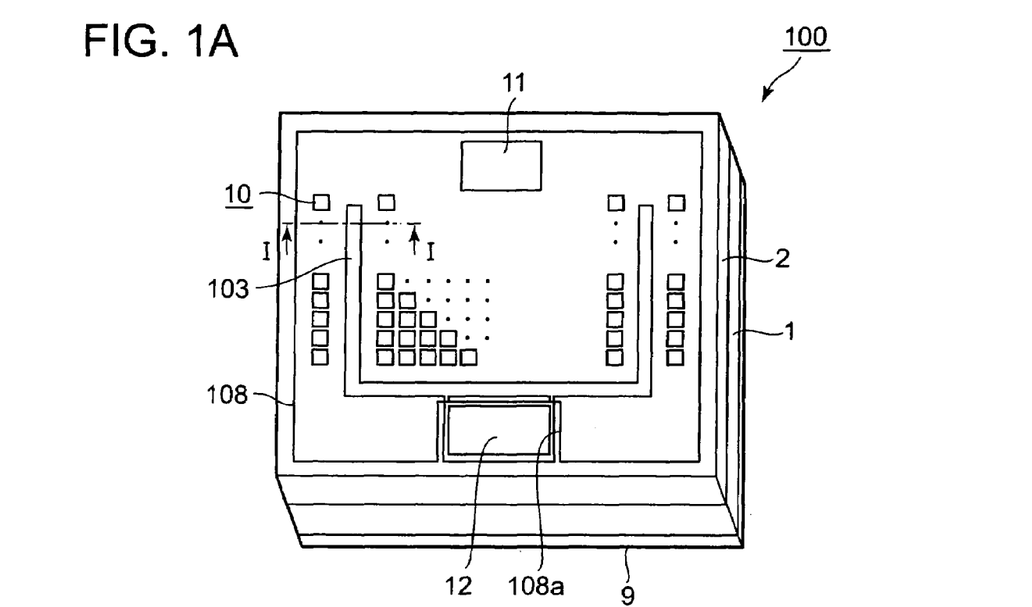
FIG. 1A is a perspective view showing a semiconductor device 100 in one embodiment of the present invention.
Figure 1B:
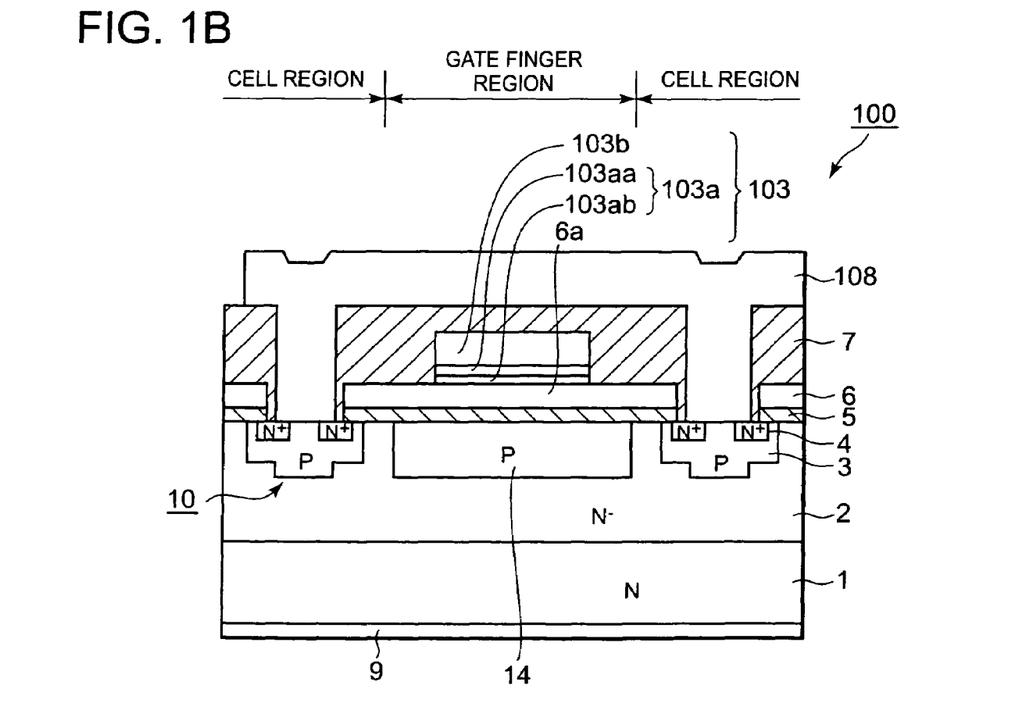
FIG. 1B is a cross sectional view along line I-I in FIG. 1A.
Figure 2:
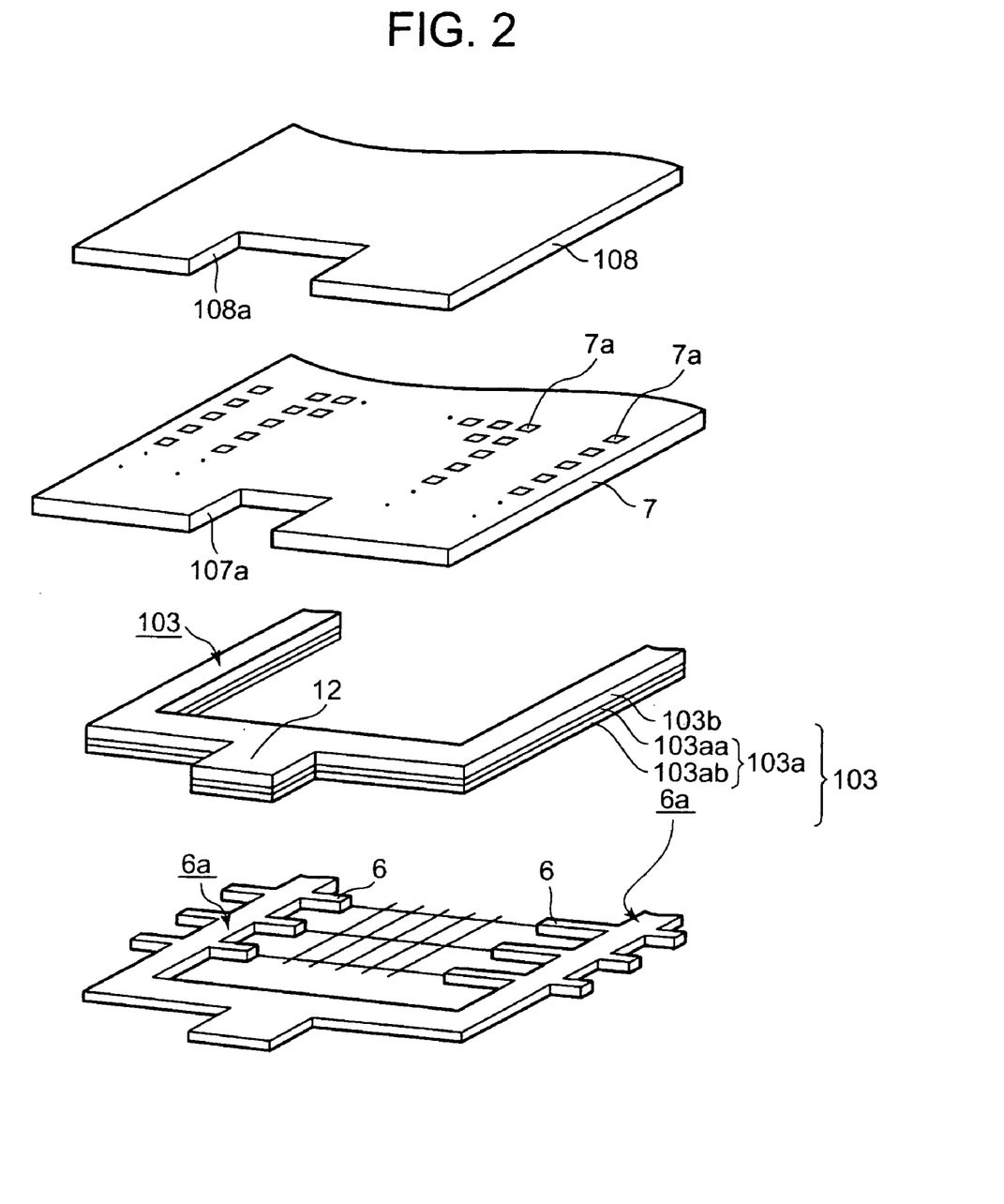
FIG. 2 is a perspective view schematically showing each of the layers in the semiconductor device 100.

FIG. 1A is a perspective view showing a semiconductor device 100 in one embodiment of the present invention and FIG. 1B is a cross sectional view along line I-I in FIG. 1A. FIG. 2 is a perspective view schematically showing each of layers in the semiconductor device 100. A lattice-lines illustrated to the inside of a polysilicon layer 6a in FIG. 2 are schematic sketch for plural electrodes 6 arranged in a lattice in a cell region.

The semiconductor device 100 includes a semiconductor substrate 1 including a cell region where plural MOSFET cells 10 are arranged, and a gate electrode 6 formed of a polysilicon (first conductive material) formed in the cell region above the semiconductor substrate 1. A gate finger region is formed in a region different from the region formed with the cell region above the semiconductor substrate 1, and a polysilicon layer (first layer) 6a of a material identical with the gate electrode 6 is formed. A wiring metal layer 103b is laminated on the polysilicon layer 6a and the polysilicon layer 6a and the wiring metal layer 103b constitute a gate lead-out electrode 103. An interlayer insulation film 7 (for example, BPSG film (silicon oxide film containing boron glass and phosphor glass)) is formed so as to cover the gate electrode 6 and the gate lead-out electrode 103 and a source electrode 108 is formed on the interlayer insulation film 7.

Further, the gate lead-out electrode 103 may further contain an adhesion metal layer 103a between the polysilicon layer 6a and the wiring metal layer 103b in contact with them.

The bottom face of the adhesion metal layer 103a is in close contact at the entire surface thereof with the polysilicon layer 6a and no interlayer insulation film is formed therebetween.

As shown in FIG. 1A, a cell region where a number of MOSFET cells 10 are arranged in a matrix is formed above the semiconductor substrate 1. The N+ type source region 4 in each MOSFET cell 10 is connected to the source electrode 108. Further, the source electrode 108 is connected with a source pad 11.

As shown in FIG. 1B, an N− type epitaxial layer 2 is formed on the N-type semiconductor substrate 1 and functions as a drain region of the MOSFET. A P-type well (base region) 3 is formed in the surface layer portion of the N− type epitaxial layer 2, and an N+ type source region 4 is formed in the surface layer portion of the P-type well 3. The gate electrode 6 is formed so as to override the MOSFET cells 10 via the gate oxide film 5.

The source electrode 108 is formed over the entire surface of the cell region when viewed in a plane. That is, the source electrode 108 is formed as a wide pattern covering the upper surface of the gate lead-out electrode 103, which does not cause division and round about of the current path as has been described for FIG. 7. This can lower the on-resistance. The material for the source electrode 108 is not particularly restricted and formed, for example, of aluminum.

As shown in FIG. 2, a recess 108a is formed to a portion of the source electrode 108 at a position where the gate pad 12 is formed.

Further, a contact via 107a is formed to a portion of the interlayer insulation film 7 at a position where the gate pad 12 is formed. The gate pad 12 is exposed through the contact via 107a and the recess 108a. Further, plural contact vias 7a are formed in the interlayer insulation film 7 for electrically connecting the source region 4, the well 3, and the source electrode 108.

The material for the gate electrode 6 is not particularly restricted and for example, formed of polysilicon. In the semiconductor device 100, the gate electrode 6 is formed of a polysilicon layer 6a (first layer). Further, as shown in FIG. 2, the gate electrode 6 and the polysilicone layer 6a of the gate lead-out electrode 103 are formed of a single layer. That is, since the gate electrode 6 and the polysilicon layer 6a of the gate lead-out electrode 103 are formed indivisibly, they are connected electrically.

In the semiconductor device 100, as shown in FIG. 1B, the gate electrode 6 and the polysilicon layer 6a of the gate lead-out electrode 103 are disposed on the gate oxide film 5 formed on the epitaxial layer 2. The gate electrode 6 and the polysilicon layer 6a of the gate lead-out electrode 103 have the same layer structure in the cross section.

As shown in FIG. 2, the gate lead-out electrode 103 is formed in the gate finger region different from the cell region. On the other hand, the gate electrode 6 is formed in the cell region. That is, the gate lead-out electrode 103 may be disposed so as to cross or transverse the cell region such that a gate voltage is distributed uniformly over the entire cell region. Further, the gate pad 12 is connected to the gate lead-out electrode 103 and they are formed indivisibly in one common layer.

The gate lead-out electrode 103 has a laminate structure where the polysilicon layer 6a, the adhesion metal layer 103a, and the wiring metal layer 103b are laminated successively. That is, the entire bottom surface of the adhesion metal layer 103a is in close contact with the polysilicon layer 6a. Accordingly, the interlayer insulation film 7 is not formed between the wiring metal layer 103b and the polysilicon layer 6a, but covers the wiring metal layer 103b, the adhesion metal layer 103a and the polysilicon layer 6a. That is, there is no need for forming the first interlayer insulation film or making contact vias 29 in the first interlayer insulation film as described above with referring to FIG. 8A.

The adhesion metal layer 103a is disposed between the polysilicon layer 6a and the wiring metal layer 103b in contact with them. That is, the adhesion metal layer 103a has the same pattern as the wiring metal layer 103b.

The material for the wiring metal layer 103b is not particularly restricted and it is preferably a material of a resistance lower than that of the polysilicon (first conductive material). In the semiconductor device 100, the wiring metal layer 103b is formed, for example, of aluminum.

On the other hand, the material for the adhesion metal layer 103a is not particularly restricted. In the semiconductor device 100, the adhesion metal layer 103a includes, for example, a laminate film where a titanium film 103ab and a titanium nitride film 103aa are laminated in this order above the polysilicon layer 6a.

The effect due to the laminate film of the adhesion metal layer 103a in the semiconductor device 100 is to be described below.

In the adhesion metal layer 103a, the titanium nitride film 103aa in the upper layer can function as a barrier for suppressing junction breakage (alloy spike failure) and/or conduction failure caused by leaching of silicon in the polysilicon layer 6a into aluminum of the wiring metal layer 103b. This can further ensure the adhesiveness between the polysilicon layer 6a and the wiring metal 103b. Further, the titanium film 103ab in the lower layer can prevent nitrogen (N) in the titanium nitride film 103aa from introducing into silicon in the polysilicon layer 6a.

Further, the adhesion metal layer 103a is in direct contact over the entire area of the bottom face thereof not by way of a contact plug, etc. with the polysilicon layer 6a and the wiring metal layer 103 being laminated therebetween. Accordingly, even when the electric conductivity of the adhesion metal layer 103a is somewhat high, increase of the wiring resistance is offset by the increase of the contact area. Accordingly, increase of the contact resistance between the wiring metal layer 103b and the polysilicon layer 6a can be suppressed.

Further, while the thickness of the laminate film is not particularly restricted, the thickness may be, for example, about 3 nm for the titanium nitride film 103aa and about 13 nm for the titanium film 103ab. In this case, the thickness of the wiring metal layer 103b is preferably about 1 μm. This can inhibit formation of evenness in the source electrode 108 of the upper layer.

The interlayer insulation film 7 is a single layer formed above the gate electrode 6 and the gate lead-out gate 103 for covering the gate electrode 6 and the gate lead-out gate 103. Since the source electrode 108 can be formed above the gate lead-out gate 103 via the interlayer insulation film 7, the source electrode 108 and the gate lead-out gate 103 can be disposed in different layers. Further, the interlayer insulation film 7 can suppress short circuit between the gate electrode 6 and the gate lead-out electrode 103 and the source electrode 108.

A drain electrode 9 is formed to the semiconductor substrate 1 on the side of the rear face. The drain electrode 9 is formed, for example, of aluminum.

Further, in the region where the gate pad 12 and the gate lead-out electrode 103 are disposed, the MOSFET cell 10 is not disposed but a P-type second well 14 is formed. The gate pad 12 has a laminate structure where the polysilicon layer 6a, the adhesion metal layer 103a, and the wiring metal layer 103b are laminated successively (not illustrated).

Provision of the P-type second well 14 serves as a diode with the N⁻ type epitaxial layer 2 to improve the breakdown voltage by enhancing the expansion of a depletion layer from the junction between the N⁻ type epitaxial layer 2 and the P-type second well 14 below the gate pad 12 and the gate lead-out electrode 103, when an inverse or reverse voltage is applied between the drain and the source.

An example of a method of manufacturing the semiconductor device 100 is to be described with reference to FIGS. 3A to 3D and FIGS. 4A and 4B. FIGS. 3A to 3D and FIGS. 4A and 4B are cross sectional views for the steps showing the method of manufacturing the semiconductor device in this embodiment.

Figure 3A:
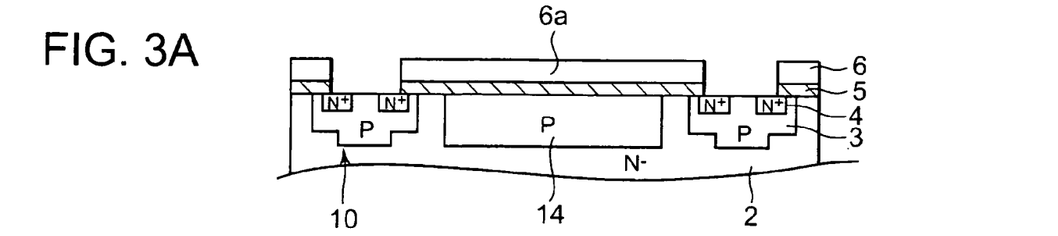
FIGS. 3A to 3D and FIGS. 4A and 4B are cross sectional views for the steps showing a method of manufacturing the semiconductor device 100.

At first, a P-type second well 14 is formed in a predetermined region of an N⁻ type epitaxial layer 2 by using a photolithographic method and an ion implantation method. Then, a gate oxide film 5 of a predetermined pattern is formed on the epitaxial layer 2 by using a photolithographic method and etching treatment.

Then, a polysilicon layer (first conductive material) is formed on the gate oxide film 5.

Then, the polysilicon layer is selectively removed by using a photolithographic method and a dry etching method (patterning) to form a gate electrode 6 and a polysilicon layer 6a of a gate lead-out electrode 103. Thus, the gate electrode 6 and the polysilicon layer 6a for the gate lead-out electrode 103 are formed indivisibly.

Subsequently, a P-type well 3 and an N+ type source region 4 are formed by an ion implantation and diffusion method. Thus, a cross sectional structure shown in FIG. 3A is formed.

From the step for forming the gate oxide film 5 to the patterning step for the polysilicon layer may also be effected as described below. After forming a P-type second well 14 in a predetermined region of an epitaxial layer 2, a gate oxide film 5 is formed by thermal oxidation or chemical vapor deposition (CVD). Then, a polysilicon layer (first conductive material) is formed on the gate oxide film 5. Then, the gate electrode 6 and the polysilicon layer 6a of the gate lead-out gate 103 are patterned by using a photolithographic method and a dry etching method, and the gate oxide film 5 is etched selectively by using a polysilicon pattern as a mask.

Figure 3B:
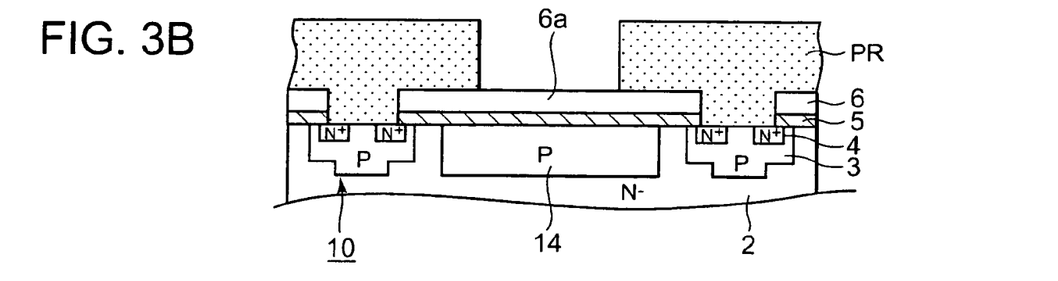

Then, as shown in FIG. 3B, a photoresist layer PR is formed over the entire surface above the gate electrode 6, and the polysilicon layer 6a (first layer) of the gate lead-out electrode 103, and an opening is formed in the photoresist layer PR for partially opening the gate lead-out electrode 103. That is, a portion of the polysilicon layer 6a is exposed and other regions than described above are covered with the photoresist layer PR.

Figure 3C:
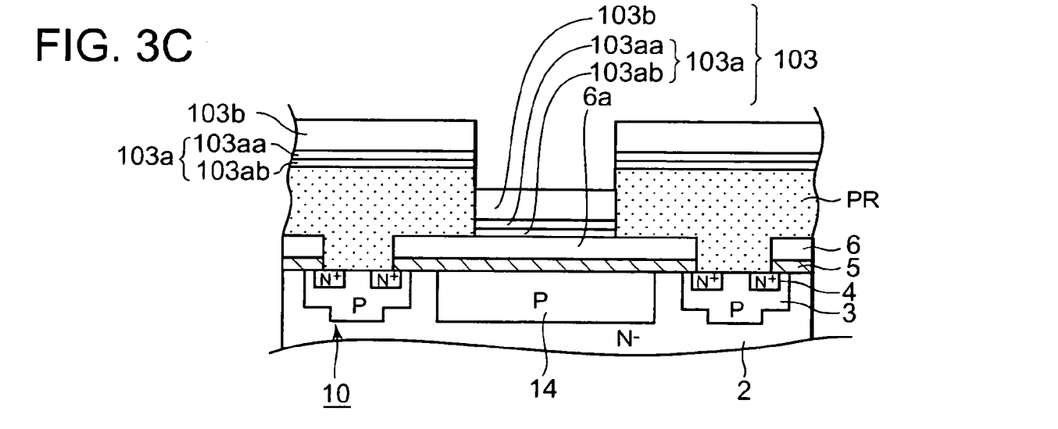

Then, as shown in FIG. 3C, a adhesion metal layer 103a such as a titanium film 103ab and a titanium nitride film 103aa is formed over the entire surface while leaving the photoresist layer PR, and the adhesion metal layer 103a is deposited on the polysilicon layer 6a exposed through the opening in the photoresist layer PR. As the adhesion metal layer 103a, for example, a titanium film 103ab and a titanium nitride film 103aa are deposited in this order. The film thickness can be made as about 13 nm for the titanium film 103ab and about 3 nm for the titanium nitride film 103aa.

Successively, a wiring metal layer 103b is formed over the entire surface and a wiring metal layer 103b is deposited just above the adhesion metal layer 103a. The adhesion metal layer 103a and the wiring metal layer 103b are formed by a sputtering method or a vapor deposition method. An aluminum film is deposited, for example, as the wiring metal layer 103b and the film thickness thereof can be made to about 1 µm.

Figure 3D:
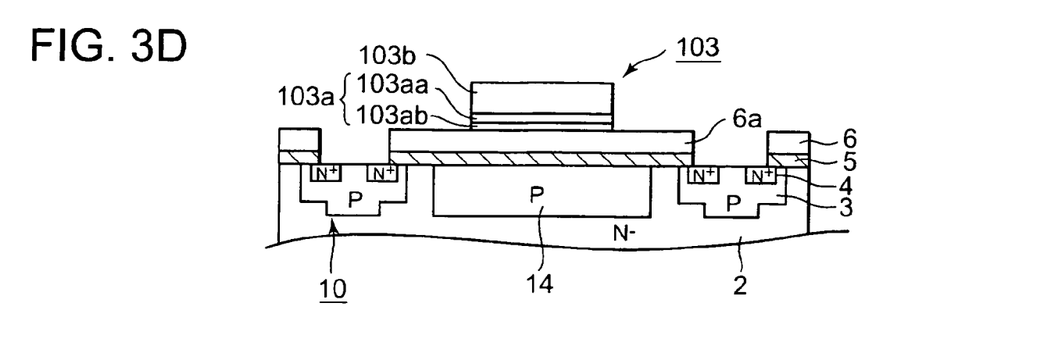

Then, as shown in FIG. 3D, the photoresist layer PR is removed by a lift-off method, and the adhesion metal layer 103a and the wiring metal layer 103b deposited above the photoresist layer PR are removed. Thus, the adhesion metal layer 103a and the wiring metal layer 103b of a predetermined pattern are left on the polysilicon layer 6a, to form a gate lead-out electrode 103 having a laminate structure composed of the polysilicon layer 6a, the adhesion metal layer 103a, and the wiring metal layer 103b.

An interlayer insulation film 7 is formed over the entire surface including the gate electrode 6 and the gate lead-out electrode 103 (polysilicon layer 6a, adhesion metal layer 103a, and wiring metal layer 103b) so as to cover them.

Figure 4A:
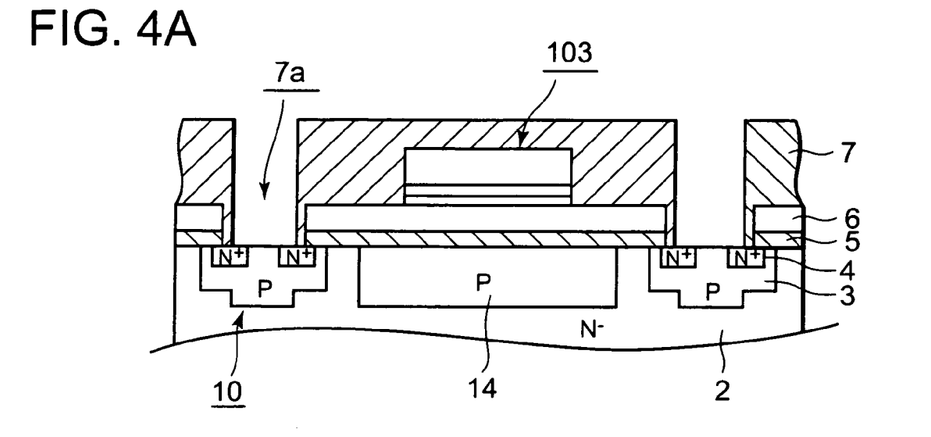

Successively, as shown in FIG. 4A, the interlayer insulation film 7 is removed selectively to form contact via 7a reaching the source region 4 and the well 3. At the same time, a contact via 107a corresponding to the gate pad 12 shown in FIG. 2 is formed.

Figure 4B:
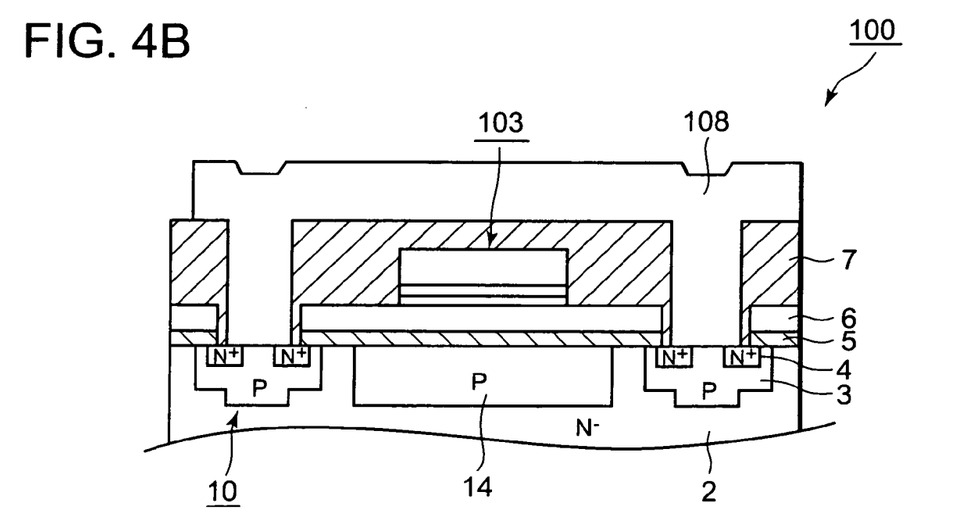

Then, as shown in FIG. 4B, a source electrode 108 is formed over the interlayer insulation film 7, and the source electrode 108 is connected electrically with the source region 4 and the well 3.

Then, the drain electrode 9 shown in FIG. 1B is formed to the semiconductor substrate 1 on the side of the rear face to obtain a semiconductor device 100 as a vertical power MOSFET.

The effect of this embodiment is to be described.

According to the method of manufacturing the semiconductor device 100, since the pattern for the wiring metal layer 103b of the gate lead-out electrode 103 is formed by the lift-off method using the photoresist layer PR as a mask, it is not necessary to form an interlayer insulation film for protecting the gate electrode 6 upon patterning the wiring metal layer 103b and it may suffice that only the interlayer insulation film 7 covering the gate electrode 6 and the gate lead-out electrode 103 may be formed as the interlayer insulation film. Thus, the gate lead-out electrode 103 and the source electrode 108 can be disposed in different layers without increasing the number of layers for the interlayer insulation film.

Further, for the number of layers, since only the interlayer insulation film 7 maybe formed for covering the gate lead-out electrode 103 and the gate electrode 6 as the interlayer insulation film for the semiconductor device 100, that is, a single layer may suffice as in the case of reference 1, the source electrode 108 can be formed so as to cover the gate lead-out electrode 103 from above without increasing the thickness of the chip and a design flexibility for a patterning layout can be enhanced. Therefore, this dose not cause branching or round about of the current path as has been described for FIG. 7 and increase of the on-resistance of the semiconductor device 100 can also be prevented. Further, increase of the potential for the cracking or peeling of the interlayer insulation film 7 can also be prevented.

According to this embodiment, the design flexibility for the patterning layout of the gate lead-out electrode 103 and the source electrode 108 can be enhanced without increasing the thickness of the semiconductor device 100.

The semiconductor device and the manufacturing method thereof according to the present invention are not restricted to the embodiment described above but various modifications are possible.

Figure 5:
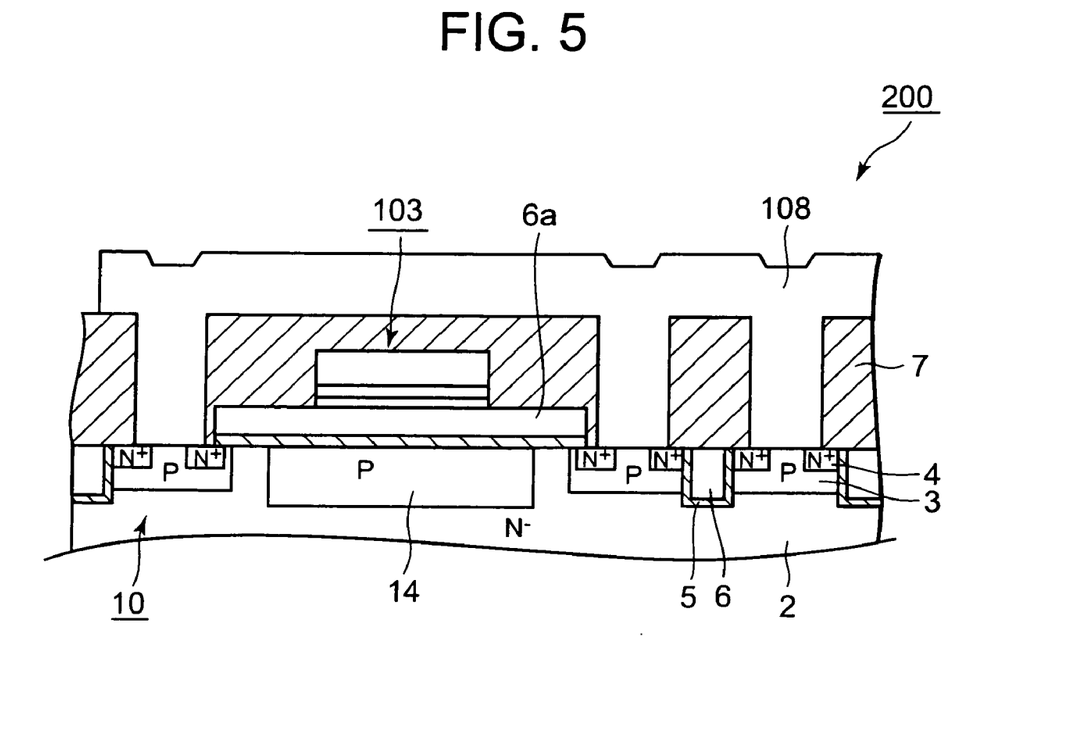
FIG. 5 is a cross sectional view showing a semiconductor device 200 as a modified example in one embodiment of the present invention.

In the embodiment described above, while description has been made to a vertical power MOSFET in which the gate electrode is disposed above the substrate, it maybe a semiconductor device 200 as a vertical power MOSFET having a trench gate structure as shown, for example, in FIG. 5. Since other structures of the semiconductor device 200 are identical with those of the semiconductor device 100, descriptions therefor are to be omitted.

In a case of he vertical power MOSFET having the trench gate structure, a gate electrode 6 is buried in the inside of a trench, a polysilicon layer constituting the gate electrode 6 is led out above the epitaxial layer 2 in a not illustrated region and formed as one pattern formed indivisibly in a common layer with polysilicon layer 6a of a gate lead-out electrode 103. That is, also in the trench gate structure, the gate electrode 6 and the polysilicon layer 6a of the gate lead-out electrode 103 are formed in one identical step.

Also in the semiconductor device 200, since the gate lead-out electrode 103 and the source electrode 108 are formed in different layers, the design flexibility of the patterning layout can be improved and the same effect as in the semiconductor device 100 can be obtained also in the semiconductor device 200.

Further, in the semiconductor device 100, while the description has been made to the interlayer insulation film 7 with respect to a layer made of a single material such as BPSG, the interlayer insulation film 7 may also be a laminate film made of plural different materials.

Figure 9:
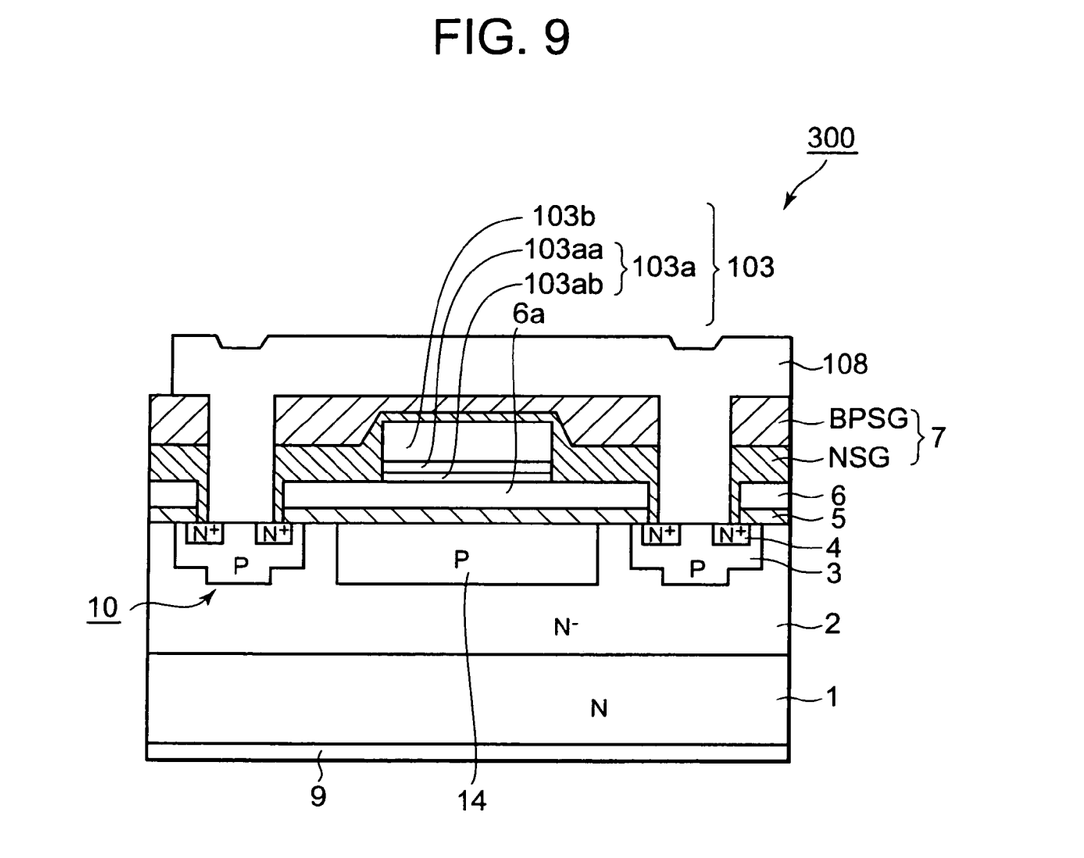
FIG. 9 is a cross sectional view showing a semiconductor device 300 as another modified example of one embodiment of the present invention.

That is, while the insulation material for the interlayer insulation film 7 is not particularly restricted, it may include, for example, as shown in a semiconductor device 300 in FIG. 9, a laminate film formed by laminating a BPSG (Boron Phosphorus Silicate Glass) film with good planarity as an upper layer and an NSG (Non-doped Silicate Glass) film as a barrier layer for preventing downward diffusion of boron or phosphorus from the BPSG film as a lower layer. Since other structures of the semiconductor device 300 are identical with those of the semiconductor device 100, descriptions therefor are to be omitted.

Further, in the embodiment described above, while description has been made to a case of using aluminum as the material for the wiring metal layer 103*b*, it may also be a material containing at least one of aluminum, copper, and tungsten. Further, the wiring metal layer may be formed of an alloy film containing aluminum or an alloy film containing copper. Use of tungsten can prevent occurrence of migration and/or aluminum spike. However, in a case of using tungsten, it is desirable that increase in the wiring resistance maybe permitted.

While all of the semiconductor devices 100 to 300 have been explained with respect to the N channel type MOSFET as the example, the channel type may also be the P-channel type. That is, the conduction type may be reversed for all impurities.

Further, the present invention is not restricted to the MOSFET but is applicable also to IGBT (Insulated Gate Bipolar Transistor). An IGBT can be constituted, for example, by using a P-type semiconductor substrate as the semiconductor substrate 1 in FIG. 1B.

Although the invention has been described above in connection with several preferred embodiments thereof, it will be appreciated by those skilled in the art that those embodiments are provided solely for illustrating the invention, and should not be relied upon to construe the appended claims in a limiting sense.

What is claimed is:

1. A semiconductor device comprising:
    a substrate containing a cell region in which a plurality of transistor cells are arranged;
    a gate electrode formed in the cell region above the substrate and made of a first conductive material;
    a gate lead-out electrode formed in a gate finger region different from the cell region and composed of a laminate structure including a first layer made of the first conductive material and a wiring metal layer formed on the first layer;
    an interlayer insulation film composed of a single layer and covering the gate electrode and the gate lead-out electrode; and
    a source electrode formed above the interlayer insulation film,
    wherein the entire surface area of the wiring metal layer that is facing towards the gate electrode is bonded to the first layer without intervening an interlayer insulation film.

2. The semiconductor device according to claim 1, wherein the first conductive material is polysilicon.

3. The semiconductor device according to claim 1, wherein the gate lead-out electrode further comprises an adhesion metal layer disposed between the first layer and the wiring metal layer in contact therewith, an entire area of the adhesion metal layer is bonded between the first layer and the wiring metal layer.

4. The semiconductor device according to claim 3, wherein the adhesion metal layer has a pattern identical with that of the wiring metal layer.

5. The semiconductor device according to claim 1, wherein the gate electrode is formed indivisibly with the first layer of the gate lead-out electrode.

6. The semiconductor device according to claim 3, wherein the adhesion metal layer is a laminate film comprising a titanium nitride film and a titanium film.

7. The semiconductor device according to claim 1, wherein the resistivity of the wiring metal layer is lower than the resistivity of the first conductive material.

8. The semiconductor device according to claim 1, wherein the wiring metal layer comprises at least one of aluminum, cupper and tungsten.

9. The semiconductor device according to claim 1, wherein the source electrode is formed over the entire surface above the cell region and the gate lead-out electrode when viewed as a plan.

10. The semiconductor device according to claim 1, wherein the gate electrode has a trench gate structure.

11. The semiconductor device according to claim 1, wherein the interlayer insulation film is a laminate film composed of a plurality of different materials.

12. The semiconductor device according to claim 11, wherein the interlayer insulation film comprises a non-doped silicate glass film and a boron phosphorous silicate glass film formed in a layer thereabove.

* * * * *